(12) United States Patent
De Bastiani

(10) Patent No.: US 6,395,121 B1
(45) Date of Patent: *May 28, 2002

(54) METHOD FOR MAKING FABRIC-BASED, ADHESIVELY MOUNTED PRINTED CIRCUIT FOR UPHOLSTERED SEATS AND THE LIKE

(75) Inventor: Norman P. De Bastiani, So. Hadley, MA (US)

(73) Assignee: Chartpak, Inc., Leeds, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,849

(22) Filed: Jul. 28, 1999

Related U.S. Application Data

(60) Division of application No. 09/362,849, filed on Jul. 28, 1999, which is a continuation-in-part of application No. 09/244,219, filed on Feb. 4, 1999.

(51) Int. Cl.⁷ .............................................. B32B 31/00
(52) U.S. Cl. ...................... 156/250; 156/256; 156/269; 156/277; 156/278
(58) Field of Search .............................. 428/209, 343, 428/346, 347, 349, 901; 442/64, 65, 66, 67, 110, 149, 150; 297/217.2, 217.3, 218.1; 174/257, 259; 156/250, 251, 277, 256, 269, 278

(56) References Cited

U.S. PATENT DOCUMENTS

| | | | |
|---|---|---|---|
| 3,855,047 A | 12/1974 | Groff | 161/150 |
| 3,864,179 A | 2/1975 | Davidoff | 156/3 |
| 4,103,102 A | 7/1978 | Klein | 174/68.5 |
| 4,191,800 A | 3/1980 | Holtzman | 428/251 |
| 4,251,312 A * | 2/1981 | Ziegler, Jr. et al. | 156/465 |
| 4,544,623 A * | 10/1985 | Audykoski et al. | 430/280.1 |
| 4,709,307 A * | 11/1987 | Branom | 362/103 |
| 4,774,634 A * | 9/1988 | Tate et al. | 361/760 |
| 4,784,901 A | 11/1988 | Hatakeyama et al. | 428/268 |
| 4,981,718 A | 1/1991 | Kuhn et al. | 427/121 |
| 5,049,704 A | 9/1991 | Matouschek | 174/261 |
| 5,162,135 A | 11/1992 | Gregory et al. | 427/121 |
| 5,292,573 A | 3/1994 | Adams, Jr. et al. | 428/196 |
| 5,302,807 A | 4/1994 | Zhao | 219/211 |
| 5,316,830 A | 5/1994 | Adams, Jr. et al. | 428/195 |
| 5,371,657 A | 12/1994 | Wiscombe | 362/103 |
| 5,455,749 A | 10/1995 | Ferber | 362/103 |
| 5,474,327 A | 12/1995 | Schousek | 280/735 |
| 5,531,601 A | 7/1996 | Amoroso | 439/37 |
| 5,624,736 A | 4/1997 | DeAngelis et al. | 216/7 |
| 5,625,333 A | 4/1997 | Clark et al. | 338/2 |
| 5,626,948 A | 5/1997 | Ferber et al. | 428/195 |
| 5,719,749 A * | 2/1998 | Stopperan | 174/254 |
| 5,720,892 A | 2/1998 | DeAngelis et al. | 428/196 |
| 5,763,058 A * | 6/1998 | Isen et al. | 428/209 |
| 5,767,466 A | 6/1998 | Durrani | 200/61.54 |
| 6,013,346 A * | 1/2000 | Lewis et al. | 156/465 |

* cited by examiner

Primary Examiner—Deborah Jones
Assistant Examiner—Stephen Stein
(74) Attorney, Agent, or Firm—Schweitzer Cornman Gross & Bondell LLP

(57) ABSTRACT

A flexible printed circuit, sometimes referred to as a flexible membrane circuit, is screen printed onto one surface of a tightly woven polyester or nylon taffeta fabric. The opposite side of the fabric is coated with a long life pressure sensitive adhesive, protected until use by a suitable release sheet, or coated with a long life heat activated adhesive also protected with a suitable release sheet. The adhesive side of the fabric is applied to the underside of upholstery fabric, for example, the underside of an automobile seat. This provides an economical and functionally effective means of providing complex circuitry for sensing the presence of a person on the seat and/or detecting the weight of such person, etc. Significant savings are realized over conventional circuit-forming techniques.

7 Claims, 1 Drawing Sheet

METHOD FOR MAKING FABRIC-BASED, ADHESIVELY MOUNTED PRINTED CIRCUIT FOR UPHOLSTERED SEATS AND THE LIKE

RELATED APPLICATION

This application is a division of my application Ser. No. 09/362,849, filed Jul. 28, 1999, which in turn was a continuation-in-part of my application Ser. No. 09/244,219, filed Feb. 4, 1999.

BACKGROUND AND SUMMARY OF THE INVENTION

It is currently a common practice to embed switches and sensors in upholstered seats, such as automobile seats to perform various control functions, such as to detect the presence of a driver or passenger in the seat, to sense the size and/or weight of a person in the seat, etc. Because of the flexible nature of the mediums involves, it is convenient to employ flexible membrane circuit elements, which can accommodate the flexing and distortion of the upholstery fabric and padding when a person occupies a seat.

Conventional membrane circuits are commonly constructed by printing a conductive ink onto a surface of a plastic film in the form of circuit elements. However, conventional membrane circuits are not a very suitable medium for use in connection with fabric, vinyl, or leather upholstery because they have the disadvantage of being able to bend in only two dimensions, while fabric, vinyl or leather upholstery will bend in three dimensions. Some attempts have been made to avoid the described disadvantage of plastic film membranes by coating a conductive matrix directly onto the surface of a suitable fabric in wide web roll form and later die cutting the fabric into strip sections which can be joined in a desired circuit pattern and bonded to the interior of an upholstery fabric. While such arrangements are more suitable from an aesthetic standpoint than the plastic film based membrane circuits, they are rather labor intensive and very costly, because of the die cutting waste generated as a by product of the die cutting process. Conductive fabric waste will be 50% or more, and intensive labor is required to attach the die cut strips to the inside of the upholstery. Particularly for automobile usage, for example, where several sensors may be employed, the high cost of the known fabric-based circuits is a serious disadvantage. If the conductive fabric is coated on its opposite side with a pressure sensitive (PSA), the installation still generates a 50% plus waste of the conductive fabric, although the (PSA) will reduce the labor required to attach the die cut sections to the upholstery material.

In accordance with the present invention, a novel and improved fabric-based flexible circuit is provided, in which the circuit substrate is a tightly woven polyester or nylon taffeta fabric. A conductive ink formulation is applied to one surface of the fabric in a predetermined circuit pattern, using screen printing procedures. The opposite surface of the fabric is coated with a pressure sensitive adhesive (PSA) or a heat activated adhesive for easy application to upholstery. Standard well known screen printing methods are employed to apply the conductive ink only in the graphic form that makes up the conductive circuit. The printed circuit pattern can be applied in multiple repeats on a fabric section, and the fabric section later die cut into its individual component areas. In this way, the expensive conductive ink formulation is not wasted when the circuit is die cut. The waste generated by the die cutting process will only contain the base fabric, leaving the conductive circuit portions intact on their carrier fabric sections for later application to the upholstery. The circuit elements can then easily be installed in an upholstered seat, for example, by adhesive bonding to the underside of the upholstery structure, whether the inner surface of the outer upholstery fabric or a liner of foam or fabric, for example. The fabric based circuit elements can flex and distort with the seat material and are substantially undetectable by the eye or by touch. The circuit elements can be easily installed by adhesive techniques, either by simple contact, with pressure sensitive adhesive, or by heat activated adhesives where heat is employed to soften the adhesive for bonding to the upholstery. Bonding is achieved when the heat activated adhesive cools and the adhesive returns to its original solid state.

Sensor circuit arrangements employing the new circuit elements of this invention, in addition to being functionally advantageous, are significantly less expensive to make and install than known types of fabric-based circuit elements.

For a more complete understanding of the above and other features and advantages of the invention, reference should be made to the following detailed description of a preferred embodiment of the invention and to the accompanying drawing.

DESCRIPTION OF PREFERRED EMBODIMENTS

Figure 1:
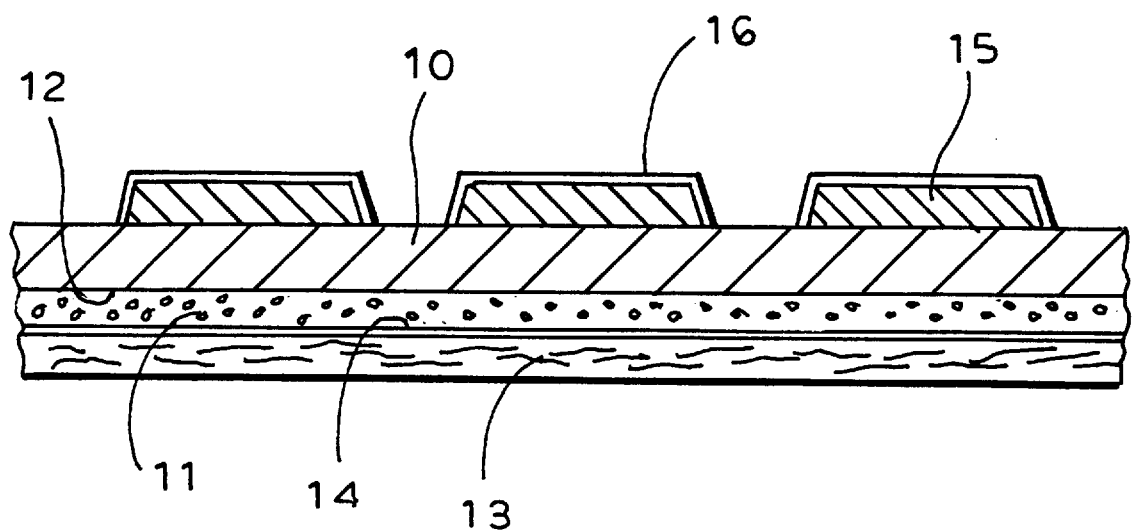
FIG. 1 is an enlarged, fragmentary cross sectional representation of a fabric-based circuit structure according to the invention.

Referring now to the drawings, the reference numeral 10 designates a taffeta fabric, which forms the base substrate for the printed circuit structure of the invention. The fabric preferably is a tightly woven taffeta, formed of nylon or polyester filament threads. In one preferred embodiment of the invention, the fabric 10 is woven to a thickness of 0.002" to 0.007". One particularly preferred embodiment utilizes a fabric thickness of 0.003".

In the form of the invention illustrated in FIG. 1, a long-life pressure sensitive or heat activated adhesive layer 11 is laminated to the bottom surface 12 of the fabric. Typically, this is accomplished by providing a release sheet 13, coated on its upper surface with a silicone release coating 14. The pressure sensitive adhesive 11 is coated, preferably in a layer of between 0.0015 and 0.020 inches, over the top of the silicone release layer 14, and dried and cured. The adhesive coated release sheet 13 is then brought into contact with the back side of the fabric and passed through a pair of laminating rolls where, under pressure, the adhesive is transferred to the fabric. Later, when it is desired to utilize the circuit structure, the release sheet 13 is peeled away from the pressure sensitive adhesive 11, enabling the product to be fixed to a working surface. The release sheet 13 may be formed of a smooth, densified Kraft paper, for example, or a smooth plastic film, in either case being coated with the silicone layer 14 for easy release from the adhesive 11.

In some cases, it may be desirable to utilize a heat activated adhesive in place of a solvent or water based pressure sensitive adhesive (PSA) 11. In the case of heat activated adhesive, heat is employed to coat the adhesive directly onto the fabric and subsequently to apply the conductive printed circuit to the upholstery. A silicone coated release paper or parchment paper 13 would be used to protect and maintain a clean adhesive surface with either type adhesive used.

Pursuant to the invention, a flexible, conductive ink composition 15 is deposited onto the surface of the fabric substrate 10, by common, well known screen printing techniques. The conductive inks 15 are flexible and have suitable elasticity to be able to bend and distort with the fabric 10 as required for the intended utilization. The conductive inks may be custom formulated to achieve particular circuit objectives. However, for many purposes, standard, commercially available conductive inks may be utilized. Representative of such commercially available products are No. 5025 Silver Conductor and No. 7102 Carbon Conductor, from duPont. Also, No. 479SS Silver Base and No. 440D Graphite Base, from Acheson Colloids. Typically, silver and carbon black components are blended to achieve a specified level of electrical conductivity. A typical blend might be two thirds of the silver based ink and one third of the carbon based ink.

For most purposes, it is desirable to provide a protective coating 16 to encapsulate the conductive ink to prevent oxidation and scuffing, and also to minimize the effects of humidity, moisture, dirt, etc. In a typical case, the protective coating 16 may be applied using the same commonly known screen printing technique used to apply the conductive pattern 15.

In a typical production operation, a section of fabric mounted for screen printing may be many times larger than the area of the circuit to be printed thereon. In such cases, multiple repeats of the same circuit are imprinted on the fabric surface, and finite sections containing printed conductive circuits are die cut or otherwise severed to separate the individual circuit areas from the larger section.

Figure 2:
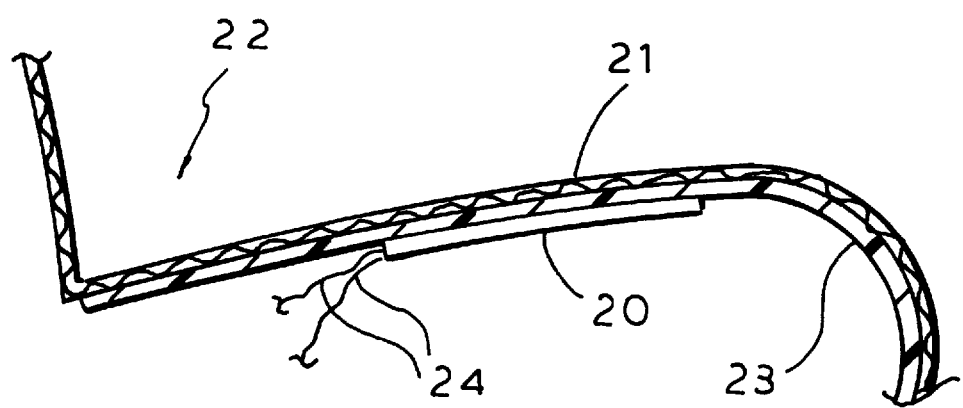
FIG. 2 is a simplified schematic representation showing a circuit element of the invention installed in an upholstery seat.

In a typical usage of the circuit structure of the invention, a circuit element 20 (FIG. 2) is mounted underneath upholstery fabric 21 forming part of a seat structure 22. The adhesive layer 11 of the element, be it pressure sensitive or heat activated or other, is bonded to a support surface 23 inside of the upholstery fabric and is appropriately connected by wires or cables 24 to relevant sensing circuitry (not shown). The circuit element 20 typically is not directly bonded to the outermost layer of upholstery fabric, but may be mounted upon a liner such as a cushioning foam 24. In either case, the circuit element is closely associated with the seat 22 and is subject to bending and flexing and distortion resulting from the presence of a person on the seat and the typical movements of such person. Because the base substrate 12 is a fabric material, the entire circuit structure easily flexes and distorts as necessary to follow the flexing and distortion of the seat upholstery. At the same time, since the mounted circuit element 20 is primarily a section of fabric, it is for all practical purposes unnoticeable to the eye or to the touch.

An important advantage of the circuit structure of the present invention resides in the fact that it presents the circuit on a fabric base substrate, but does so at an enormous savings in cost relative to conventional fabric-based circuit arrangements.

It should be understood, of course, that the specific forms of the invention herein illustrated and described are intended to be representative only, as certain changes may be made therein without departing from the clear teachings of the disclosure. Accordingly, reference should be made to the following appended claims in determining the full scope of the invention.

I claim:

1. The method of making a flexible printed circuit structure for use in connection with upholstered seats, which comprises (a) furnishing a circuit substrate formed of lightly woven, thin fabric having top and bottom surfaces, (b) applying adhesive to one of said surfaces, (c) screen printing the other of said surfaces with multiple repeats of a desired electrical circuit pattern, (d) die cutting said circuit substrate into multiple sectional areas each including a complete individual repeat of said desired circuit pattern, (e) providing a flexible and distortable upholstery material, and (f) adhesively bonding individual ones of said die cut sectional areas to a surface of said upholstery material.

2. The method according to claim 1, wherein (a) said thin fabric is provided in a thickness of about 0.003 inch.

3. The method according to claim 1, wherein (a) said adhesive comprises a long life acrylic based pressure sensitive adhesive or a long life heat activated adhesive.

4. The method according to claim 3, wherein (a) said pressure sensitive adhesive is applied to a thickness of about 0.0015 inches to 0.002 inches.

5. The method according to claim 1, wherein (a) a protective layer is applied over said electrical circuit pattern.

6. The method according to claim 5, wherein (a) said protective layer is selectively screen printed over substantially only the pattern of the printed circuit.

7. The method according to claim 3, wherein (a) said heat activated adhesive is thermally actuated for adhesive bonding of said cut sectional areas to said upholstery material.

* * * * *